US009791526B2

(12) United States Patent
Barmet et al.

(10) Patent No.: US 9,791,526 B2
(45) Date of Patent: Oct. 17, 2017

(54) DYNAMIC FIELD CAMERA ARRANGEMENT FOR MAGNETIC RESONANCE APPLICATIONS AND METHODS FOR OPERATING THE SAME

(75) Inventors: Christoph Barmet, Zurich (CH); David Brunner, Jona (CH); Bertram Wilm, Zurich (CH); Klaas Prussmann, Zurich (CH)

(73) Assignees: Eidgenossische Technische Hochschule (ETH), Zurich (CH); Universitat Zurich, Zurich (CH)

( * ) Notice: Subject to any disclaimer, the term of this patent is extended or adjusted under 35 U.S.C. 154(b) by 825 days.

(21) Appl. No.: 14/112,660

(22) PCT Filed: Apr. 23, 2012

(86) PCT No.: PCT/EP2012/057420
§ 371 (c)(1),
(2), (4) Date: Feb. 28, 2014

(87) PCT Pub. No.: WO2012/143574
PCT Pub. Date: Oct. 26, 2012

(65) Prior Publication Data
US 2014/0327438 A1    Nov. 6, 2014

(30) Foreign Application Priority Data

Apr. 22, 2011    (EP) .................................... 11163612

(51) Int. Cl.
*G01V 3/00*    (2006.01)
*G01R 33/36*    (2006.01)
(Continued)

(52) U.S. Cl.
CPC ......... *G01R 33/3607* (2013.01); *G01R 33/24* (2013.01); *G01R 33/246* (2013.01);
(Continued)

(58) Field of Classification Search
USPC ......................................................... 324/301
See application file for complete search history.

(56) References Cited

U.S. PATENT DOCUMENTS

| 5,682,891 A * | 11/1997 | Sonoki | ................. G01R 33/563 |
|---|---|---|---|
| | | | 324/307 |
| 8,409,807 B2 * | 4/2013 | Neely | .................... G01N 24/08 |
| | | | 435/6.12 |

(Continued)

FOREIGN PATENT DOCUMENTS

| EP | 1 582 886 A1 | 10/2005 |
|---|---|---|
| WO | WO 2007/118715 A1 | 10/2007 |

OTHER PUBLICATIONS

M. Pavan et al., "Frequency-Division Multiplexing for Concurrent Imaging and Field Monitoring", ISMRM-ESMRMB Joint Annual Meeting Proceedings (2010).

(Continued)

*Primary Examiner* — Rodney Fuller
(74) *Attorney, Agent, or Firm* — George Pappas

(57) ABSTRACT

A dynamic field camera arrangement for monitoring electromagnetic field behavior in a spatial region comprises a main magnetic field and a radiofrequency (RF) field limited to a first RF band, particularly in an MRI or NMR apparatus. The arrangement comprises a magnetic field detector set comprising a plurality of low-frequency magnetic field detectors, each one of said magnetic field detectors comprising a magnetic resonance (MR) active substance, means for pulsed MR excitation of said substance and means for receiving an MR signal generated by said substance, wherein said pulsed excitation and said MR detector signal is in a second RF band that does not overlap said first RF band. The MR signal receiving means comprise a first RF (Continued)

filter which suppresses RF signal from said first RF band and transmits RF signal from said second RF band.

20 Claims, 9 Drawing Sheets

(51) Int. Cl.
    *G01R 33/24*     (2006.01)
    *G01R 33/28*     (2006.01)
    *G01R 33/58*     (2006.01)

(52) U.S. Cl.
    CPC ........ *G01R 33/3657* (2013.01); *G01R 33/243* (2013.01); *G01R 33/281* (2013.01); *G01R 33/58* (2013.01)

(56) References Cited

U.S. PATENT DOCUMENTS

| | | | |
|---|---|---|---|
| 2003/0071624 A1 | 4/2003 | Schwarz | |
| 2007/0116602 A1* | 5/2007 | Lee | G01N 24/08 422/82.01 |
| 2012/0100546 A1* | 4/2012 | Lowery, Jr. | C12Q 1/6895 435/6.12 |
| 2013/0244238 A1* | 9/2013 | Neely | B82Y 25/00 435/6.11 |
| 2015/0241530 A1* | 8/2015 | Schmid | G01R 33/422 324/322 |
| 2016/0187442 A1* | 6/2016 | Hachitani | G01R 33/543 324/322 |

OTHER PUBLICATIONS

C. Barmet et al., "A Transmit/Receive System for Magnetic Field Monitoring of In Vivo MRI", Magnetic Resonance in Medicine, 62: 269-276 (2009).

C. Barmet et al., "Spatiotemporal Magnetic Field Monitoring for MR", Magnetic Resonance in Medicine, 60:187-197 (2008).

C. Barmet et al., "Concurrent higher-order field monitoring for routine head MRI: an integrated heteronuclear setup", ISMRM 2010, p. 216.

N. DeZanche et al., "NMR Probes for Measuring Magnetic Fields and Field Dynamics in MR Systems", Magnetic Resonance in Medicine 60:176-186 (2008).

C. Barmet et al., "A third-order field camera with microsecond resolution for MR system diagnostics", ISMRM 2009, p. 781.

P. Sipila et al., "Continuous magnetic field mapping with pulsed 1H NMR probes", ISMRM 2009, p. 782.

\* cited by examiner

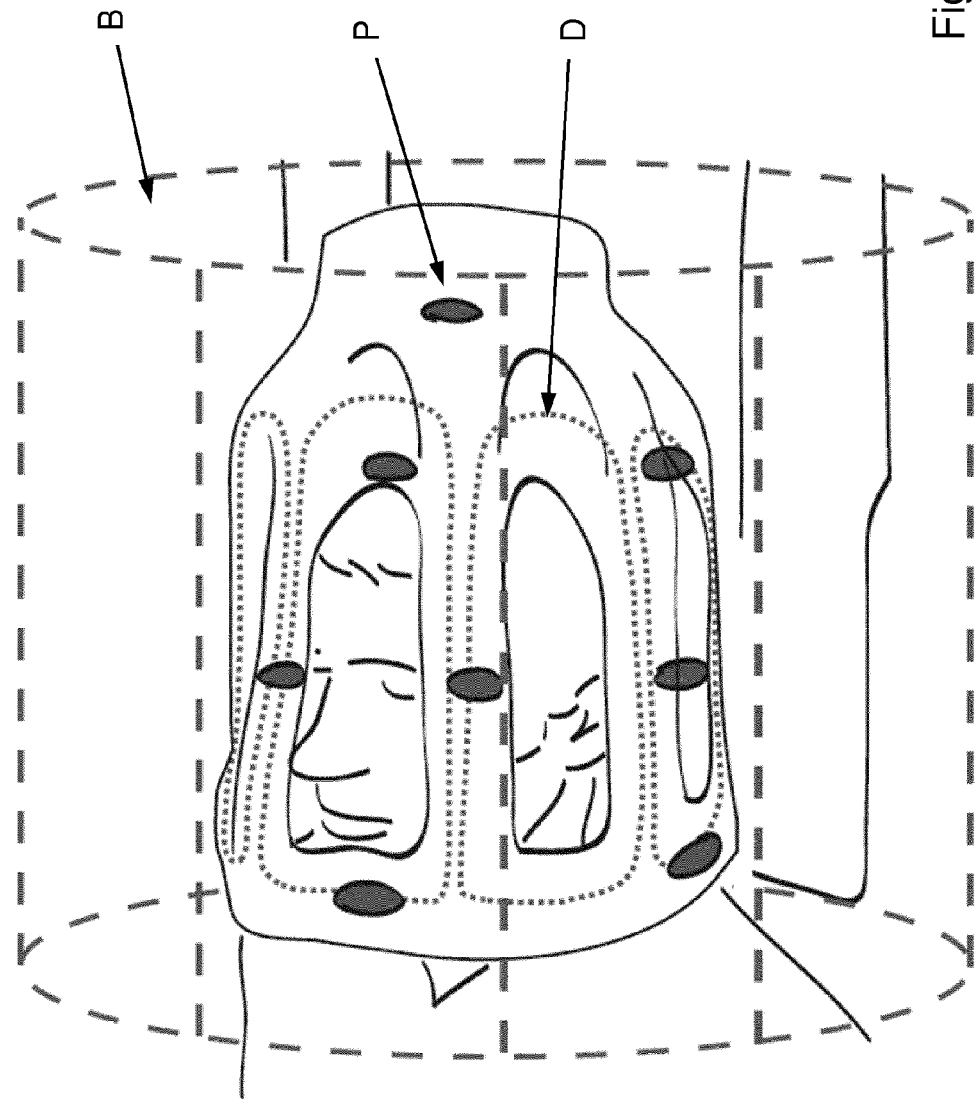

DYNAMIC FIELD CAMERA ARRANGEMENT FOR MAGNETIC RESONANCE APPLICATIONS AND METHODS FOR OPERATING THE SAME

This application claims priority from PCT application No. PCT/EP2012/057420 filed Apr. 23, 2012 which claims priory from European application No. EP 11163612.2 filed on Apr. 22, 2011, the disclosures of which are incorporated herein by reference.

FIELD OF THE INVENTION

The present invention generally relates to a dynamic field camera arrangement for magnetic resonance applications and to methods of operating the same.

BACKGROUND OF THE INVENTION

An important requirement for high quality magnetic resonance (MR) applications such as nuclear magnetic resonance (NMR) spectroscopy and magnetic resonance imaging (MRI) is to have accurate information about the spatiotemporal electromagnetic field evolution during the various measurements.

It has long been recognized that the spatiotemporal low-frequency magnetic field evolution in a volume of interest can be determined by means of an array comprising a plurality of magnetic field probes arranged within or in the vicinity of the volume of interest (Barmet et al. *ISMRM* 2009 p. 780). Such arrangements are occasionally referred to as "dynamic magnetic field cameras". It allows for observing the spatiotemporal low-frequency magnetic field evolution with the full bandwidth of the latter.

A promising approach for magnetic field cameras relies on arrays of NMR probes, i.e. on probes exploiting the magnetic field dependence of NMR signals (DeZanche et al. *MRM* 60:176-186 (2008); Sipilä et al. *ISMRM* 2010 p. 781). In particular, such arrangements use probes operating in a pulsed NMR mode.

Moreover, as already disclosed in EP 1 582 886 A1, arrays of NMR probes can be used as a monitoring setup during execution of an NMR or MRI sequence. The magnetic field information thus obtained is used for an improved reconstruction of the images or spectra and/or for adjusting the MR sequence so as to account for imperfections in the magnetic field behavior.

It has been proposed to use frequency-division multiplexing for concurrent imaging and field monitoring, e.g. with four field probes (Pavan et al. *ISMRM-ESMRMB Joint Annual Meeting Proceedings* (2010) *XP*-002658386). In this method, the signal of each monitoring probe is combined with that of one imaging coil so as to jointly use only a single receiver channel, enabling concurrent field monitoring without the need for additional spectrometer hardware. When using NMR field probes based on $^{19}F$ together with an $^1H$ imaging set-up, the fluorine signal of each field probe was mixed up to a frequency close to the Larmor frequency of the protons, although not overlapping with the same. In order to reduce signal-to-noise degradation caused by the superposition of noise from the shifted-fluorine and from the proton channels, it was suggested to use band-pass filtering before combining the two signal channels. In particular, the magnetic field probe channel would be provided with a bandpass filter that selectively transmits the up-converted fluorine signal.

A shortcoming of the magnetic field camera and monitoring arrangements and methods used so far is caused by the fact that in order to avoid unacceptable interference with the principal measurement and/or damage of certain components the field probe data acquisition is limited to certain time windows of the principal measurement, where no radio-frequency (RF) excitation pulse is played out. Therefore, the information supplied by the NMR field probes actually does not cover an important time region of the principal measurement. An additional drawback is the fact that in general the sequence of pulses used to excite the NMR field probes is generally not synchronized to the pulse sequence of the principal measurement; consequently the field probe excitation pulses might occur at any time during the actual MR sequence.

Accordingly, it is an object of the present invention to provide an improved dynamic field camera arrangement and methods for operating the same.

SUMMARY OF THE INVENTION

According to one aspect of the invention, there is provided a dynamic field camera arrangement for monitoring electromagnetic field behavior in a spatial region comprising a main magnetic field and a radiofrequency (RF) field limited to a first RF band, the arrangement comprising:
  a magnetic field detector set comprising a plurality of low-frequency magnetic field detectors, each one of said magnetic field detectors comprising a magnetic resonance (MR) active substance, means for pulsed MR excitation of said substance and means for receiving an MR signal generated by said substance, wherein said pulsed excitation and said MR detector signal is in a second RF band that does not overlap said first RF band;
  wherein said MR signal receiving means comprise a first RF filter which suppresses RF signal from said first RF band and transmits RF signal from said second RF band.

Typically, the spatial region comprising a main magnetic field and a radiofrequency (RF) field in a first RF band is the sample region or cavity of an NMR or MRI setup wherein the first RF band comprises the Larmor frequency of a nuclear species of interest at a given strength of the main magnetic field.

The definition of "low-frequency magnetic field detector" as used herein refers to a magnetic field detector resolving a magnetic field evolution bandwidth of typically 50 kHz and maximally about 1 MHz. This frequency range should not be confused with the acquisition frequency of the low-frequency magnetic field detectors, which will generally be substantially different therefrom since it is determined by the Larmor frequency of the MR active substance used for the magnetic field detectors.

According to the present invention, the low-frequency magnetic field detectors (i.e. the "magnetic field probes") of the magnetic field detector set are of the pulsed MR type. Such magnetic field probes comprise a magnetic resonance (MR) active substance, which will also be called "probe substance", means for pulsed MR excitation of the probe substance and means for receiving an MR signal generated by said substance. The pulsed excitation of the probe substance and correspondingly the MR signal received therefrom is in a second RF band that does not overlap the first RF band.

The MR signal receiving means of the magnetic field probes comprise a first RF filter for suppressing RF signal from said first RF band, particularly from the intense RF pulses used e.g. to excite the principal nucleus in the course of a principal MR measurement. It will be understood that the term "first RF filter" may actually refer to a plurality of filtering devices arranged at suitable locations in the receiving chain leading from the magnetic field probe to the associate probe signal detector. In general, it should be ensured that substantial filtering occurs before the first non-linear element of the receiving chain which might be at risk of being saturated or going into compression. In particular, the saturation of RF amplifiers in the receive chain of the magnetic field detector set must be assured while an RF pulse in the first RF band is transmitted.

The magnetic field probes can exploit any suitable magnetic resonance mechanism, as the basic principle of such probes relies on the magnetic field dependence of a given magnetic resonance transition frequency, i.e. the Larmor frequency. In many applications the magnetic field probes are based on nuclear magnetic resonance (NMR), but electron paramagnetic resonance (EPR) can also be used. In the latter case the frequency of the second RF band used for the field probe operation is substantially higher than in the case of NMR field probes. Therefore, in cases where the first RF band corresponds to a nuclear magnetic resonance transition (e.g. in an MRI apparatus), the design of the first RF filter will be simplified when using EPR field probes.

In an advantageous embodiment, the magnetic field probes are of the pulsed nuclear magnetic resonance type as described e.g. in EP 1 582 886 A1 or in WO 2007/118715 A1. These magnetic field detectors comprise a magnetic resonance (MR) active substance, which will also be called "probe substance", means for pulsed NMR excitation of the probe substance and means for receiving an NMR signal generated by said substance. The pulsed excitation of the probe substance and correspondingly the NMR signal received therefrom is in said second RF band that shall not overlap the first RF band. In cases where the first RF band corresponds to the Larmor frequency of a certain nuclear species in said main magnetic field, separation of the first and second RF bands can be achieved by selecting a NMR active nuclear species in the probe substance (henceforth called the "field probe nucleus") that is different from the nuclear species being studied with the principal NMR or MRI setup (henceforth called the "principal nucleus").

For example, one can use $^{19}F$ as field probe nucleus in conjunction with an NMR or MRI arrangement working for $^{1}H$ as the principal nucleus. If using a 3 Tesla main magnetic field, the first RF field used for NMR excitation of $^{1}H$ will be around 127.8 MHz (+/−500 kHz in the presence of typical gradient coils, which generate superimposed magnetic fields of 10's of mT) whereas the second RF field used to operate the $^{19}F$ magnetic field probes will be around 120.1 MHz (+/−500 kHz in the presence of typical gradient coils, which generate superimposed magnetic fields of 10's of mT). The first RF filter used to protect the NMR field probes from the strong principal field needs to provide good suppression at 127.8 MHz but good transmission at 120.1 MHz.

In a particularly preferred embodiment wherein the spatial region comprising a main magnetic field and a radiofrequency (RF) field in a first RF band is the sample region or cavity of an NMR or MRI setup, the RF transmitters used to send RF pulses in the first RF band are also equipped with an RF filter suppressing signal from said second RF band. These RF filters could, e.g., be placed before and after the amplification stage. As a result the RF transmitters would not amplify and transmit substantial RF signal in the second RF band, which could be picked up by the magnetic field detector set, and be mistaken for signals originating inside these magnetic field detectors.

According to one embodiment, the dynamic field camera arrangement further comprises an RF detector set comprising at least one RF detector for receiving signal from said first RF band.

The definition of "RF detector" as used herein refers to a detector for electromagnetic fields of at least about 1 MHz. This frequency corresponds to the Larmor frequency defined by the corresponding setup (magnetic field strength) and the gyromagnetic ratio of the particle under consideration. In typical magnetic resonance setups, this frequency is several 10's of MHz to several 100's of MHz.

The above mentioned RF detectors can be used for controlling the RF field fidelity, in particular the timing, the waveform, the phase stability and the non-linearity of the RF field, RF spikes as well as RF arching. Sensitive RF probes could also detect RF field contaminations from the environment. The measurement of the three components and the polarization of the RF field is possible with suitable RF detectors, e.g. by crossed coils; this information might be used to determine the flip-angle. A set of such RF detectors, suitably placed, could be used to monitor a multichannel RF transmitter system such as a multichannel coil. In order to perform quantitative measurements of the RF field, said RF detectors need to be calibrated. Measurements made by said RF detector set could be used to calibrate timing, waveform and phase of RF transmitter system, e.g. the body coil (the RF transmitter usually integrated in MRI systems) and/or transmit/receive coils and transmit/receive coil arrays. Measurements made by said RF detector set could as well be used to ensure RF safety and/or validating safety models.

According to one embodiment, the detectors of the RF detector set further comprise an RF-filter for suppressing RF signal from the second RF band. It will be understood that the term "RF filter" may actually refer to a plurality of filtering devices arranged at suitable locations in the receiving chain leading from the RF detector to the associate RF signal detector. In general, it should be ensured that substantial filtering occurs before the first non-linear element of the receiving chain which might be at risk of being saturated or going into compression. In particular the saturation or compression of RF amplifiers in the receive chain of the RF detector set must be assured, while an RF pulse in the second RF band is transmitted.

For many applications it will be convenient to configure the RF detectors as dedicated devices. However, according to another embodiment, the RF detector is configured as an MR imaging (or spectroscopy) coil device equipped with tuning/detuning means, i.e. the imaging coils of a particular arrangement are also used as RF detectors. In particular these RF detectors can form one or several detector arrays. The RF detectors might be stiff or flexible; they can also incorporate additional electronics for adjusting the matching of the RF detector, e.g. for improving SNR or reducing the coupling between different RF detectors. Optionally the RF detectors could be tuned not to the first RF band only, but also to a third RF band, which corresponds to another nucleus. Such double-tuned coils are sometimes used, e.g., for the observation of several nuclei (e.g. 1H and 13C), typically in spectroscopic and spectroscopic imaging measurements, but possibly also in imaging methods.

According to one embodiment, the field camera arrangement further comprises means for detecting an acoustic signal in said spatial region. The detection of the acoustic signals could be performed by one or several microphones mounted on the dynamic field camera. The microphones could be directional microphones. Importantly the acoustic detectors have to work in a strong magnetic field. When applying a suitable MR sequence, the acoustic signals can be processed to obtain acoustic gradient-impulse-response functions and/or acoustic shim-impulse-response functions. The delay of the acoustic signal receive path can be assessed in a calibration measurement and be taken into account in order to conform to the time axes of both the RF detector set and the low-frequency magnetic field detector set. Information on the acoustic response of MRI scanners gathered in this way could be applied in the development of new MRI hardware or sequences aiming at improved patient comfort. Noise sources could be easily spotted and analyzed, allowing for sequence or hardware adjustments. Also, knowing the interplay between gradient (or shim) function and the acoustics generated by it, sequences that generate more pleasant or patient friendly sounds could be implemented.

According to one embodiment, the field camera arrangement further comprises an RF load device. The RF load acts as a dump load for RF power sent by the RF transmitter system of the MR apparatus and reduces RF reflection. The RF load could consist of a solid-state load ring, an MR active liquid (preferably not giving rise to signals in the second RF band) or a tissue simulating liquid. In order not to disturb the low-frequency magnetic field measurements, eddy currents induced in the RF load must be kept to a minimum by choosing materials of high electrical resistance and/or suitable shape and placement.

According to one embodiment, the MR active substance is selected from the group consisting of:
  hexafluoro-2,3-bis(trifluoromethyl)butane-2,3-diol (also called perfluoropinacol, CAS number: 918-21-8),
  hexafluoro-2-propanol (CAS number: 920-66-1),
  2,2,2-trifluoroethanol (CAS number: 75-89-8),
  3,3,3-trifluoro-1-propanol (CAS number: 2240-88-2),
  trifluoroacetic acid (CAS number: 76-05-1),
  hexafluorobenzene (CAS number: 392-56-3), and
  perfluoro 15-crown-5 (CAS number: 97571-69-2);
wherein any hydrogen is independently selected from $^1$H and $^2$H;
said magnetic field detector further comprising at least one dopant admixed to said MR active substance, said dopant being a complex of a divalent or trivalent metal cation with two or three equivalents, respectively, of a charge neutralizing ligand, wherein said ligand is selected from the group consisting of:
  acetylacetonate (also known as "acac"),
  6,6,7,7,8,8,8-heptafluoro-2,2-dimethyl-3,5-octanedionate (also known as "fod"),
  hexafluoroacetylacetonate,
  acetate,
  tetramethylcyclopentadienyl,
  propoxide, and
  2,2,6,6-tetramethyl-3,5-heptanedionate (also known as "tmhd"),
wherein any hydrogen is independently selected from $^1$H and $^2$H; and wherein M is a metal selected from the group consisting of Fe, Mn, Cr, Co, Ni, Cu or anyone of the rare earth metals.

The above listed MR active substances are particularly suitable for NMR field probes operating with $^{19}$F as the probe nucleus. In general, such substances should have a high concentration of probe nuclei, thus yielding intense signal. Preferably, the $^{19}$F-NMR signal should be simple, most preferably a single line. Substitution of any one hydrogen ($^1$H) nucleus or any subset of $^1$H nuclei by deuterium ($^2$H) may be used to eliminate any remaining $^1$H signal from the magnetic field probes. Such signal might be picked up by a MR imaging (or spectroscopy) coil device and confound the data processing and/or image reconstruction of $^1$H signals acquired from said MR imaging coil device.

An advantageous NMR active substance is perfluoropinacol due to its high $^{19}$F density.

In some applications it is desirable to excite the NMR field probes at a high repetition frequency so as to obtain field information with good temporal resolution. Said repetition time could be chosen such that the signal decay in a magnetic field probe is dominated by the T2 decay, and not by the dephasing due to gradient action. Accordingly, it may be desirable to have substances with very short T1 and T2 relaxation times, e.g. on the order of 10's to 100's of microseconds.

Another advantageous NMR active substance is hexafluoro-2-propanol due to its small size, which results in favorable T1/T2 ratios for short relaxation times.

A further shortening of relaxation times and/or a shift of the NMR frequency of the MR active substance in order to minimize overlap with other signals can be achieved by admixing suitable dopants.

One advantageous dopant is dysprosium tris(6,6,7,7,8,8,8-heptafluoro-2,2-dimethyl-3,5-octanedionate) or Dy[fod]$_3$.

Another advantageous dopant is tris(tetramethylcyclopentadienyl)Gd(III).

A further advantageous dopant is erbium(III) tris(2,2,6,6-tetramethyl-3,5-heptanedionate) or Er(TMHD)$_3$.

A particularly favorable combination of NMR active substance and dopant is perfluoropinacol doped with Fe(III)(acac)$_3$, Gd(fod)$_3$, Er(acac)$_3$ or Dy(acac)$_3$; for the latter three dopants H$_2$O or D$_2$O can be added as solubilizer. Perfluoropinacol doped with Fe(III)(acac)$_3$ leads to a T1/T2 ratio only slightly larger than 1; however, it is not suitable to reach very short relaxation times.

Another favorable combination of NMR active substance and dopant is hexafluoro-2-propanol with Gd(fod)$_3$.

The above mentioned dopants are principally used for adjusting relaxation times and/or for shifting the NMR resonance frequency. However, such dopants may also have an influence on other properties, e.g. on phase transitions, notably melting and boiling temperatures. For example, the melting point of perfluoropinacol can be lowered without significant changes in its NMR relaxation properties by adding as a dopant a metal complex with a non-paramagnetic center such as Al or Be.

According to one embodiment, said magnetic field detector further comprises a solubilizer compound admixed to said MR active substance and to said dopant. As a result it is possible to admix substantially larger amount of dopant to the MR active substance, which in turn allows for achieving more pronounced shifts and/or relaxation time changes. Advantageous solubilizers for the systems described above are H$_2$O, acetylacetone and acetone, all of which can also be partially or fully deuterated. For example the concentration of Dy(acac)3 in perfluoropinacol can be substantially increased by the addition of H$_2$O.

According to another aspect of the invention, there is provided a method of operating the above defined dynamic field camera arrangement in conjunction with a magnetic resonance (MR) apparatus, the MR apparatus comprising:
  means for generating a main magnetic field in a detection volume of said MR apparatus; and
  means for generating a radiofrequency (RF) field limited to a first RF band;

the method comprising the steps of:
subjecting said low-frequency magnetic field detectors to a pulsed excitation, acquiring MR signals from said low-frequency magnetic field detectors and processing the same to obtain low frequency spatio-temporal magnetic field characteristics in said detection volume, wherein said pulsed excitation and said MR detector signal is in a second RF band that does not overlap said first RF band
acquiring RF signals from said set of RF detectors; thereby obtaining a temporarily synchronized set of RF field evolution and low frequency magnetic field evolution.

It is understood that in order to establish a temporarily synchronized relation between RF field and low frequency magnetic field evolution, it will be necessary to calibrate the apparatus for time delays between the receive chains of the RF detectors and the low-frequency magnetic field detectors and amongst each other.

According to a further aspect of the invention, there is provided a method of operating the above defined dynamic field camera arrangement in conjunction with a magnetic resonance (MR) apparatus, the MR apparatus comprising:
means for generating a main magnetic field in a detection volume of said MR apparatus;
means for generating superimposed gradient and/or higher order magnetic fields and an RF field limited to a first RF band according to an MR sequence for forming images or spectra;
means for acquiring object signals from an object located in said detection volume;
the method comprising the steps of:
subjecting said low-frequency magnetic field detectors to a pulsed excitation, acquiring MR signals from said low-frequency magnetic field detectors and processing the same to obtain low frequency spatio-temporal magnetic field characteristics in said detection volume, wherein said pulsed excitation and said MR detector signal is in a second RF band that does not overlap said first RF band
acquiring RF signals from said set of RF detectors;
acquiring object signals from said object during execution of said MR sequence;
thereby obtaining a temporarily synchronized set of RF field evolution, low-frequency magnetic field evolution and object signals.

It is understood that in order to establish a temporarily synchronized relation between RF field and low frequency magnetic field evolution, it will be necessary to calibrate the apparatus for time delays between the receive chains of the RF detectors and the low-frequency magnetic field detectors as well as amongst the detectors of each set. As a result of such a calibration, the dynamic field camera can display RF field and low-frequency magnetic field evolution on a well-established time axis.

If the time axis of the dynamic field camera needs to be synchronized with the time-axis of the MR apparatus—e.g. for the determination of delays in the gradient chain of an MRI apparatus—a suitable calibration is required. TTL (or equivalent) signals output by the MR apparatus can facilitate this calibration.

According to one embodiment, the pulsed excitation and/or signal acquisition of the low-frequency magnetic field detectors is triggered by a feature of the RF signal in the first RF band. The trigger event could be initiated by a slope, an integral, a threshold, etc. on the detected RF signal in the first band.

According to one embodiment, the method further comprises the step of calculating a temporal evolution of the magnetization based on said temporarily synchronized set of RF field evolution and low frequency magnetic field evolution. In particular this involves modeling magnetization dynamics (e.g. by solving the Bloch equations) and requires some user input such as main magnetic field off-resonance, longitudinal relaxation time T1, transverse relaxation time T2, initial magnetization MO, RF pulse amplitude |B1| and angle, diffusion tensor and perfusion constant.

Applications thereof are the visualization, sequence diagnostics (e.g. the effectiveness of signal spoiling) as well as incorporation into image reconstruction.

According to one embodiment, the temporarily synchronized set of RF field evolution and low frequency magnetic field evolution is used for adjusting the RF field in the first RF band and/or for adjusting superimposed low-frequency magnetic fields as generated by the MR apparatus. These low-frequency magnetic fields are typically generated by so-called gradient coils and/or shim coils that can create $0^{th}$ and higher-order low-frequency magnetic field terms. The correction of the low-frequency magnetic fields could be achieved in a quasi real time fashion, with a delay on the order of milliseconds or less. For such a correction the actual low-frequency magnetic field evolution has to be compared to the expected low-frequency magnetic field evolution and arising deviations should then be cancelled by demanding corresponding responses from the gradient and/or shim systems. Measures must be taken to stabilize this feedback. In this way slow drifts (e.g. physiology induced drifts or drifts caused by the MR apparatus itself) could be cancelled.

According to one embodiment, the temporarily synchronized set of RF field evolution, low-frequency magnetic field evolution and object signals is used for reconstruction of images or spectra.

According to one embodiment, of operating a dynamic field camera arrangement comprising means of acoustic signal detection, an acoustic signal is acquired temporally synchronized with the set of RF field evolution and low frequency magnetic field evolution. The acoustic signal can be used in the development of noise cancelling methods and/or equipment for MR apparatus.

BRIEF DESCRIPTION OF THE DRAWINGS

The above mentioned and other features and objects of this invention and the manner of achieving them will become more apparent and this invention itself will be better understood by reference to the following description of various embodiments of this invention taken in conjunction with the accompanying drawings, wherein are shown:

FIG. 5 a typical in-vivo measurement arrangement in an MRI situation.

DETAILED DESCRIPTION OF THE INVENTION

Figure 1:
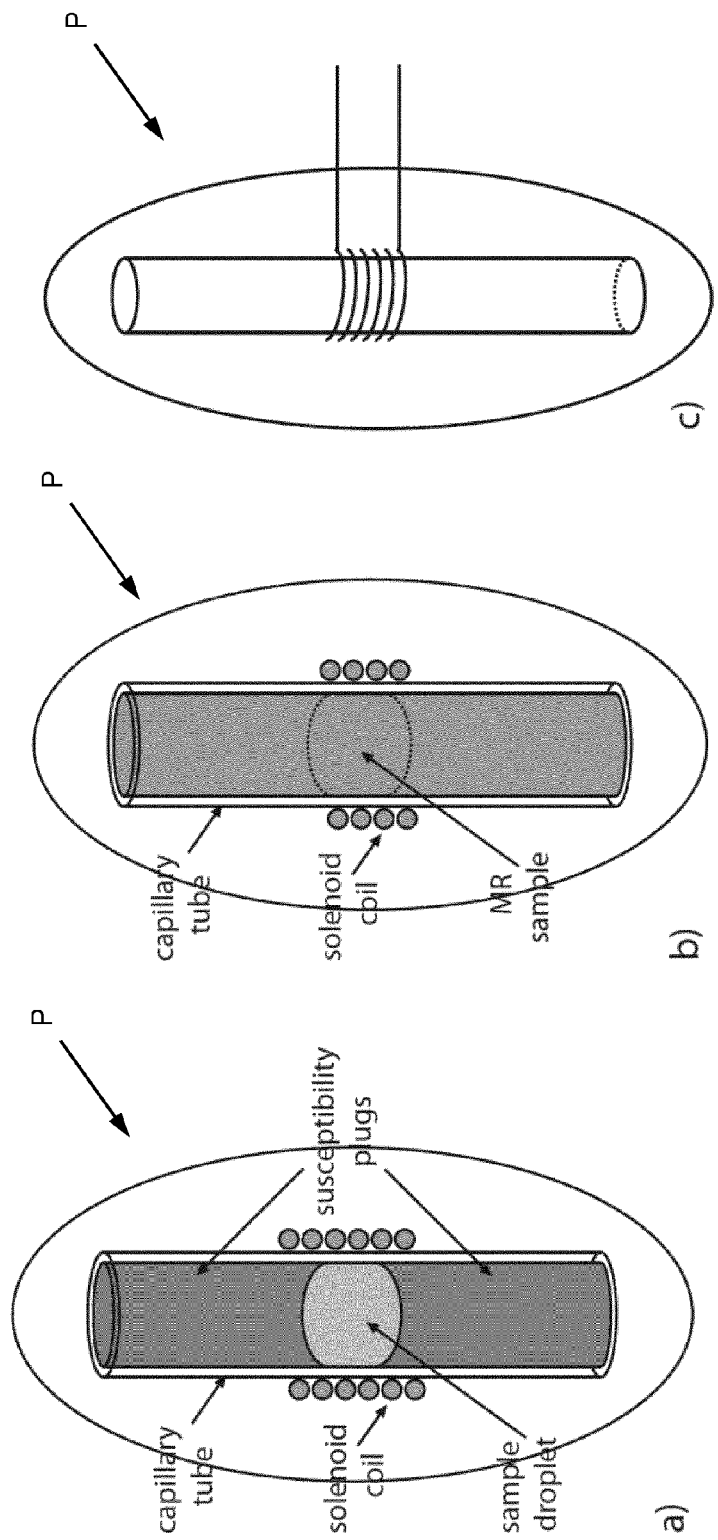
FIG. 1 a representation of various MR field probes.

The low-frequency magnetic field detectors, also called "probes" P, shown in FIGS. 1a to 1c each comprise a magnetic resonance (MR) active substance, which in most cases is in liquid form. As mentioned further above, the magnetic field detectors are intended for monitoring electromagnetic field behavior in a spatial region comprising a main magnetic field ($B_0$) and a radiofrequency (RF) field limited to a first RF band, particularly in an MRI or NMR apparatus. Each detector has means for pulsed MR excitation of said substance and means for receiving an MR signal generated by said substance, realized here as one solenoid coil wound around a capillary tube serving as container for the MR active substance. It is understood that the excitation and receiving means comprise further components not shown in these drawings, particularly electronic components for generating the RF excitation pulse and other electronic components for receiving and processing the probe signal. It is also understood that a design with a single solenoid is merely one of many possible configurations.

In the example of FIG. 1a) the sample droplet is physically confined in all three spatial directions. In axial direction along the glass capillary the droplet is confined in both directions by a liquid of equal susceptibility, but not giving MR signal at the MR frequency of the droplet, [DeZanche et al. *MRM* 60:176-186 (2008)]. In the example of FIG. 1b) the sample droplet is not physically confined along the axial direction; instead, the droplet confinement along the capillary direction is achieved by the transmit B1+ and receive B1− sensitivities of the solenoid coil [Barmet et al. *MRM* 62:269-276 (2009)]. A general schematic representation of such magnetic field detectors P as will be used in other figures is shown in FIG. 1c). As mentioned further above, the pulsed excitation of the MR detectors takes place in a second RF band that does not overlap the first RF band.

Figure 2A:
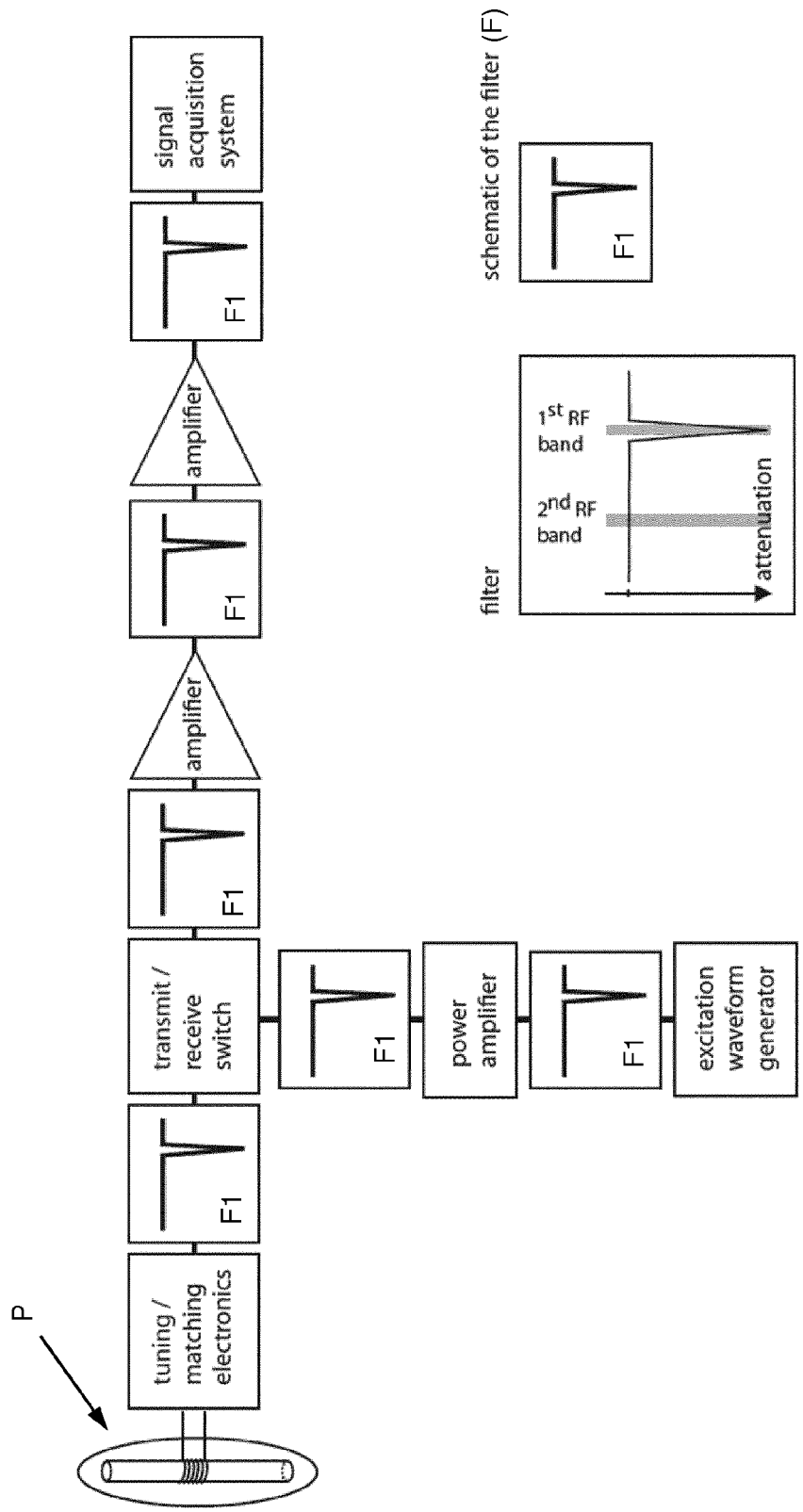
FIG. 2 various embodiments of RF filtering.
Figure 2B:
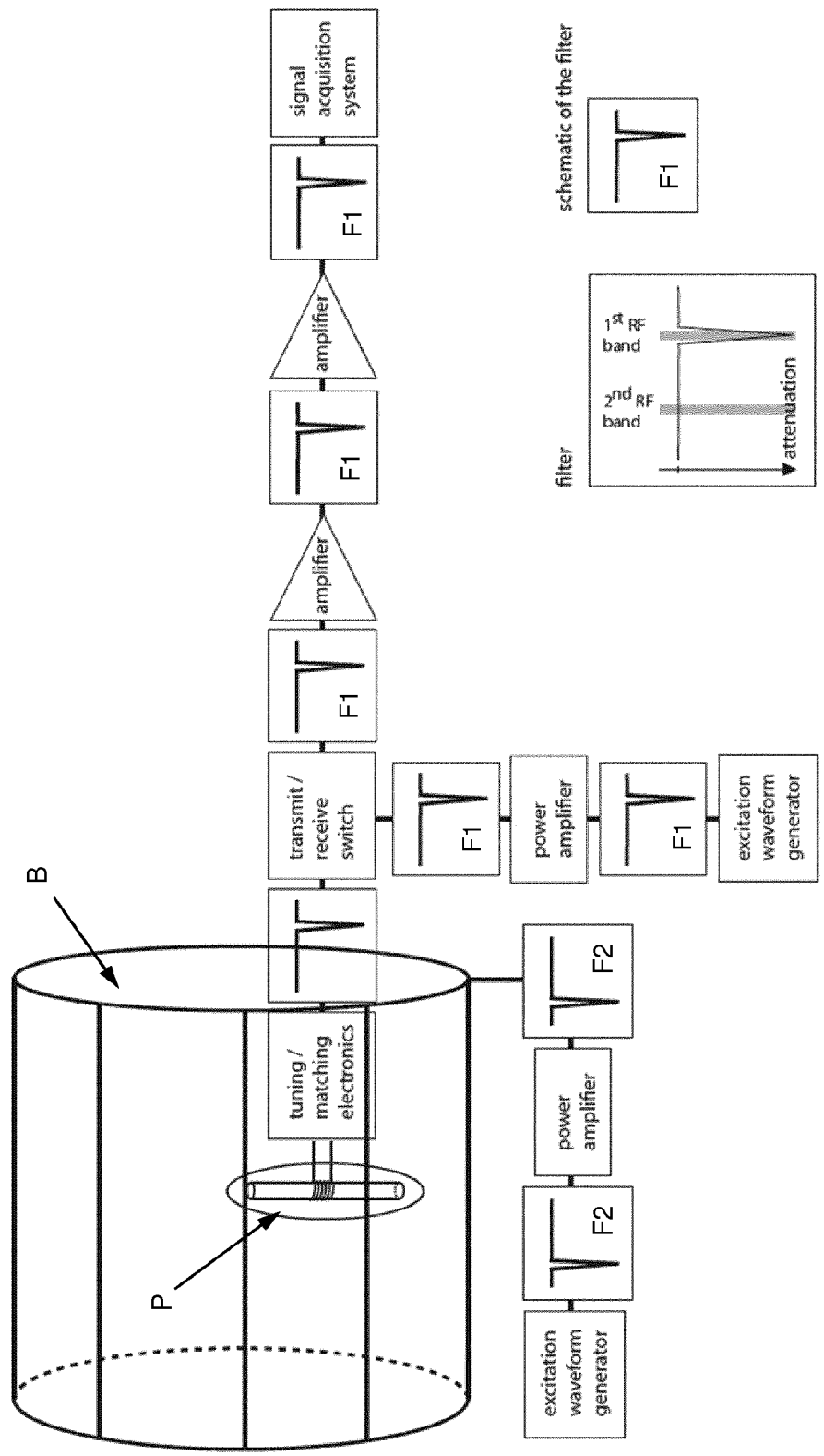
Figure 2C:
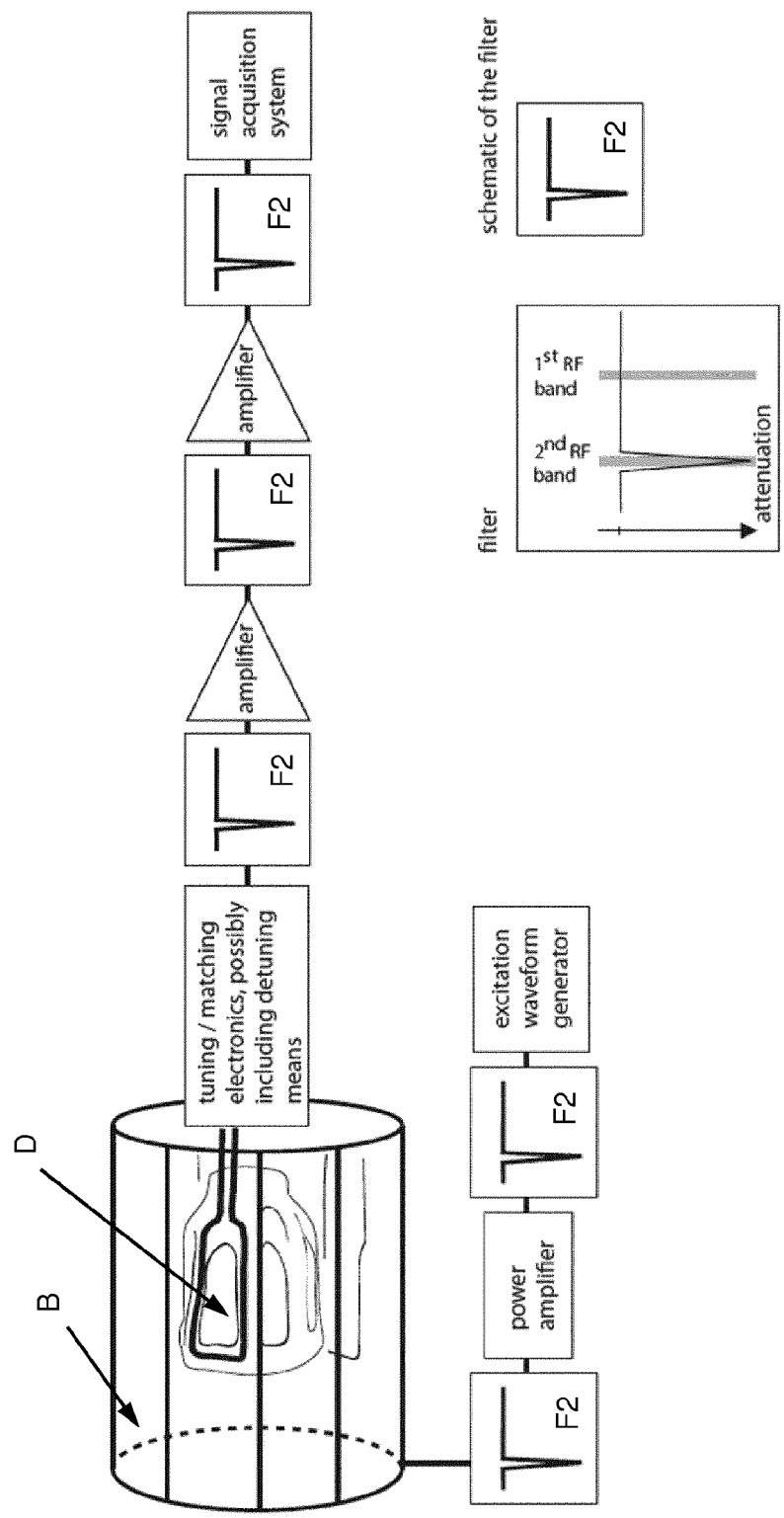
Figure 2D:
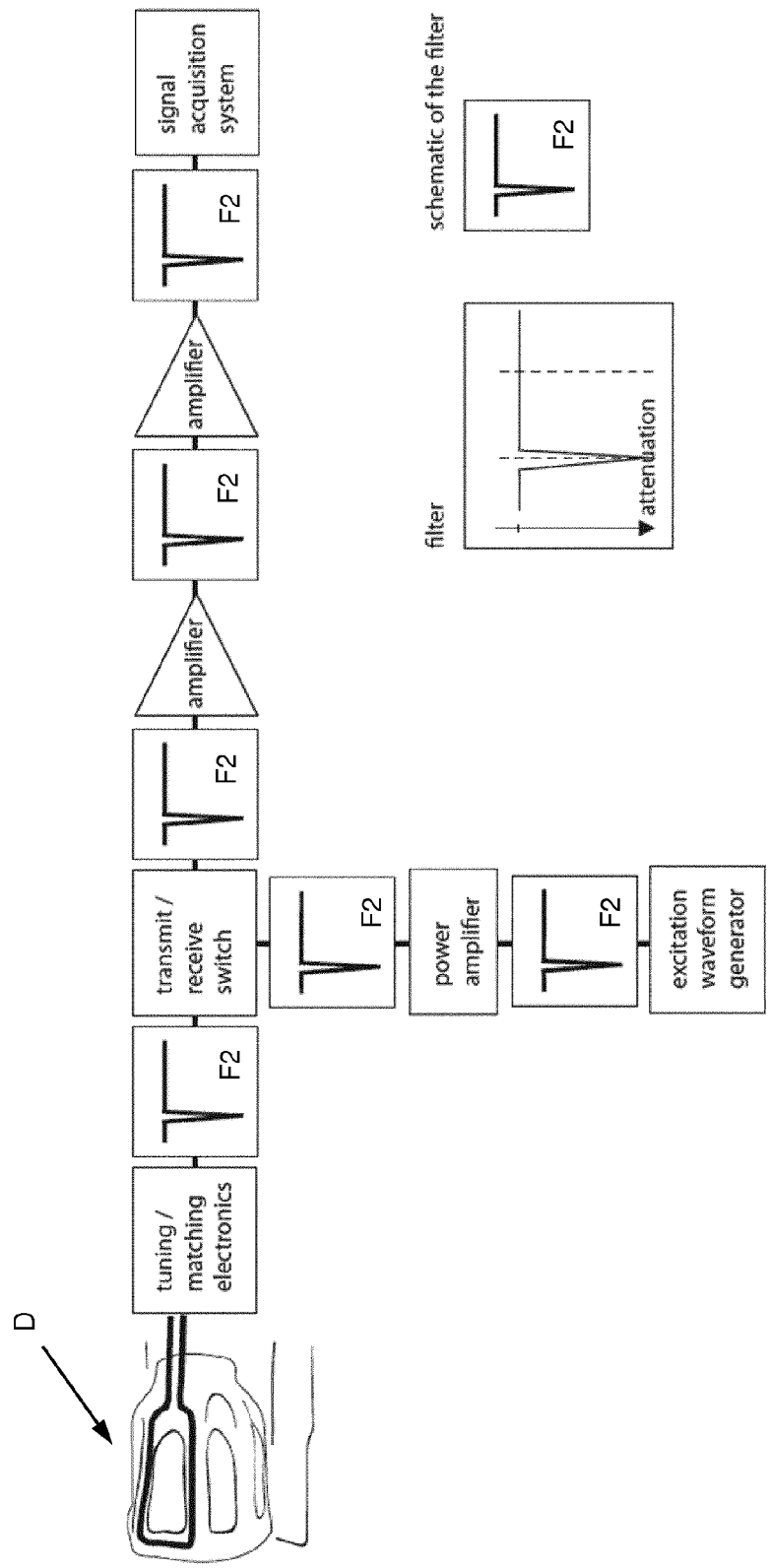
Figure 2E:
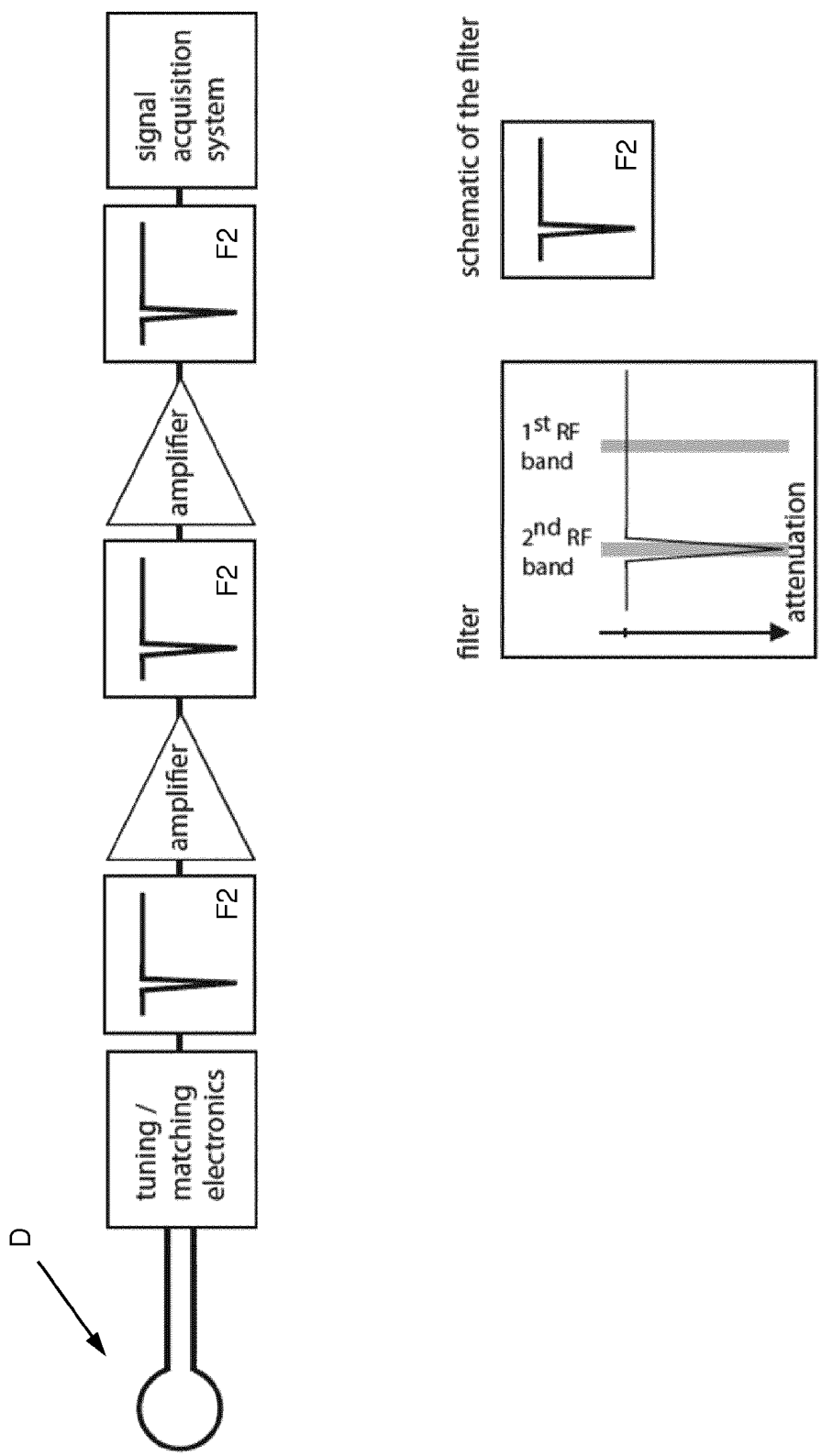

The MR signal receiving means further comprise a first RF filter F1 which suppresses RF signal from the first RF band, which would cause unwanted interference or may even damage the receiving means, but transmits RF signal form the second RF band, which is the signal to be acquired by the magnetic field probe P. Various arrangements of such RF filters are shown in FIG. 2, wherein individual filter elements are represented as a square box with a schematic representation of a transmission dip (see FIG. 2a). In particular, FIG. 2 a) shows possible positions of first filter elements F1 in the signal transmission and acquisition paths of MR field probes. FIG. 2b) shows possible first filter F1 positions in the signal transmission and acquisition paths of MR field probes, and possible second filter positions F2 in the excitation coil B (sending in the first RF band) transmit path; note the different stopbands of the filters F1 and F2. As amply discussed hereinabove, the second filter means F2 are intended for suppressing RF signal in the second RF band. FIG. 2c) shows possible second filter F2 positions in the signal transmission and acquisition paths of an arrangement with an excitation body coil B and an RF field detector D. FIG. 2d) shows possible second filter F2 positions in the signal acquisition path of an RF field detector D, and possible second filter F2 positions in the excitation coil (sending in the first RF band) transmit path. FIG. 2e) shows possible second filter F2 positions in the signal acquisition path of a RF field detector D.

Figure 3:
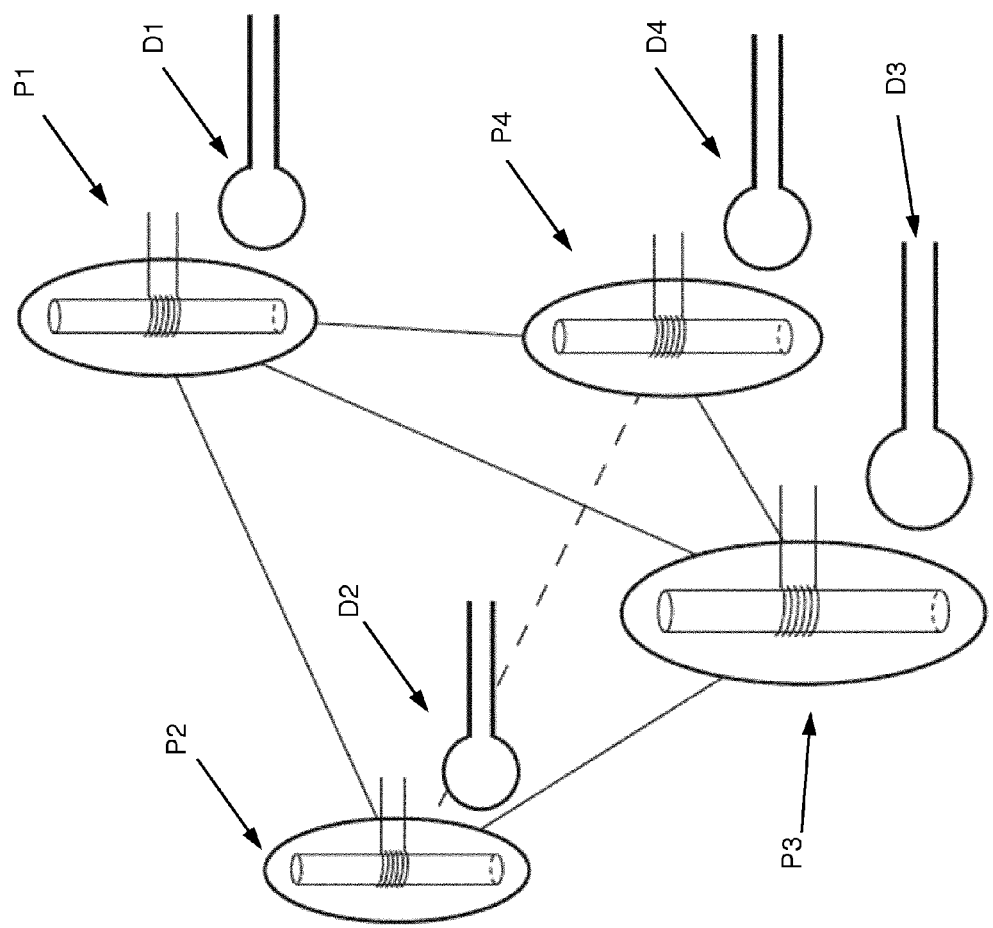
FIG. 3 an arrangement of four MR low-frequency magnetic field probes with four RF field detectors.

An arrangement of four MR low-frequency magnetic field probes (P1, P2, P3, P4) and of four RF field detectors (D1, D2, D3, D4) configured as small loops is shown in FIG. 3. The two detector sets are mounted in a tetrahedral fashion which results in a favorable conditioning of the low-frequency magnetic field measurement [Barmet et al. *MRM* 60:187-197 (2008)]. Other arrangements are possible; the low-frequency magnetic field probes should be arranged such as to deliver a reasonable conditioning of the low-frequency magnetic field measurement, whereas the RF field detectors should be placed such as to optimally couple to the RF transmitter structures whose RF fields shall be measured.

Figure 4:
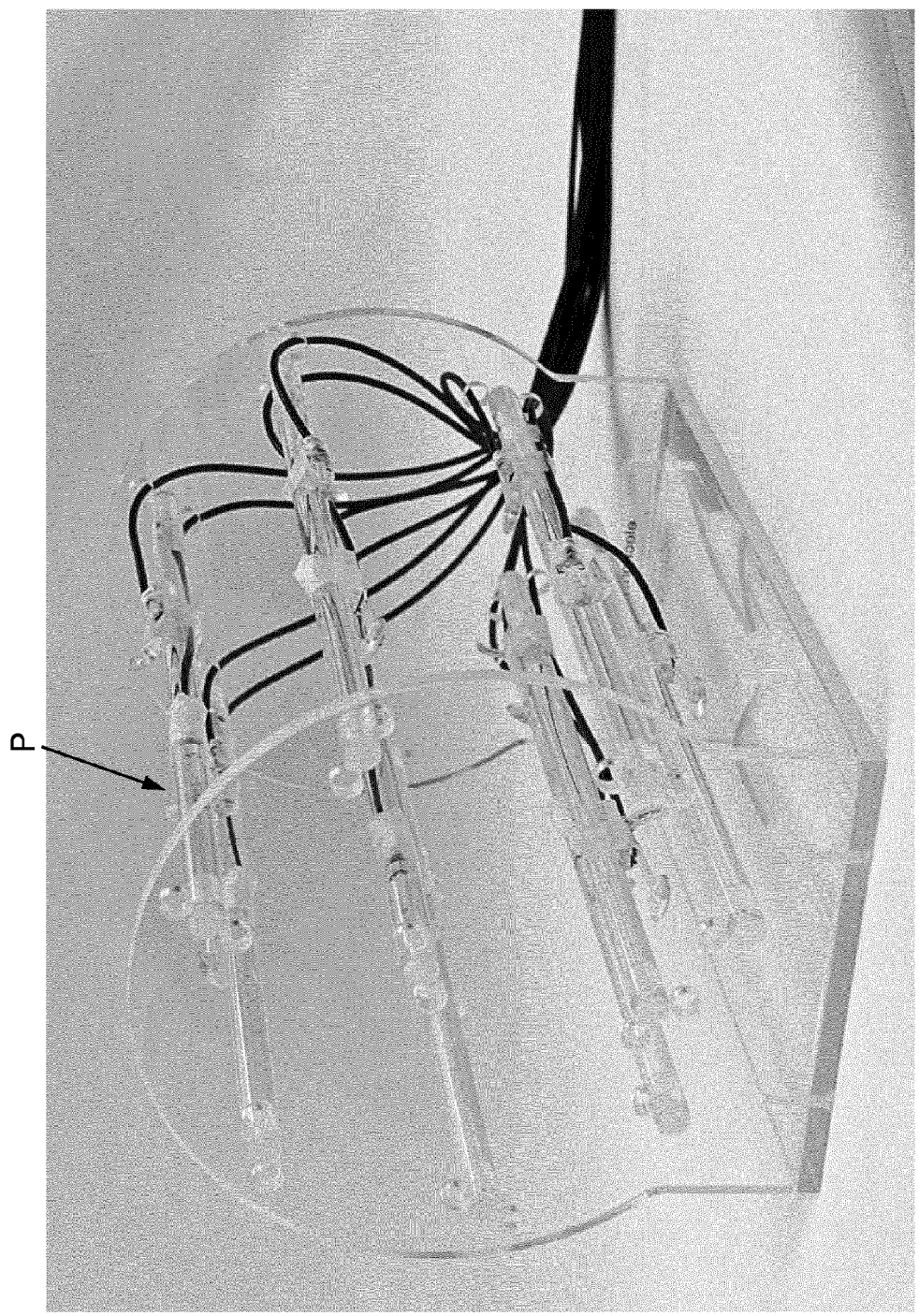
FIG. 4 a dynamic field camera head equipped with 16 NMR field probes.

FIG. 4 shows a dynamic field camera head equipped with 16 NMR field probes P, mounted on a frame such as to be located on a sphere of 20 cm diameter. Each NMR field probe is equipped with an electronic circuitry for tuning and matching. The signals are lead away by coaxial cables to circuitry with T/R switch and preamplifier.

FIG. 5 shows a typical in-vivo measurement arrangement in an MRI situation. The head-coil comprises a number of RF receive coils D (dotted) for detecting the object (patient) signal. Moreover the head-coil is equipped with a number of NMR field probes P (black outline with gray filling). The body coil B (dashed) is usually used to excite NMR in the object (patient); alternatively the head-coil can be a transmit/receive coil and excite as well as detect NMR signals in the object (patient).

The invention claimed is:

1. A dynamic field camera arrangement for monitoring electromagnetic field behavior in a spatial region comprising a main magnetic field and a radio frequency (RF) field limited to a first RF band, particularly in an MRI or NMR apparatus, the arrangement comprising:
a magnetic field detector set comprising a plurality of low-frequency magnetic field detectors (P), each one of said magnetic field detectors comprising a magnetic resonance (MR) active substance, means for pulsed MR excitation of said substance and means for receiving an MR signal generated by said substance, wherein said pulsed excitation and said MR detector signal is in a second RF band that does not overlap said first RF band;
wherein said MR signal receiving means comprise a first RF filter (F1) which suppresses RF signal from said first RF band and transmits RF signal from said second RF hand.

2. The dynamic field camera arrangement as defined in claim 1, further comprising an RF detector set comprising at least one RF detector for receiving signal from said first RF band.

3. The dynamic field camera arrangement as defined in claim 2, wherein each one of said RF detectors further comprises a second RF filter (F2) which suppresses RF signal from said second RF band.

4. The dynamic field camera arrangement as defined in claim 3, wherein said RF detector is configured as an MR imaging coil device equipped with tuning/detuning means.

5. The dynamic field camera arrangement as defined in 3, further comprising an RF load device.

6. The dynamic field camera arrangement as defined in claim 2, wherein said RF detector is configured as an MR imaging coil device equipped with tuning/detuning means.

7. The dynamic field camera arrangement as defined in 6, further comprising an RF load device.

8. A method of operating a dynamic field camera arrangement according to claim 2 in conjunction with a magnetic resonance (MR) apparatus, the MR apparatus comprising:
means for generating a main magnetic field in a detection volume of said MR apparatus; and
means for generating a radiofrequency (RF) field limited to a first RF band;
the method comprising the steps of:
subjecting said low-frequency magnetic field detectors to a pulsed excitation, acquiring MR signals from said low-frequency magnetic field detectors and processing the same to obtain low frequency spatiotemporal magnetic field characteristics in said detection volume, wherein said pulsed excitation and said MR detector signal is in a second RF band that does not overlap said first RF band acquiring RF signals from said set of RF detectors;

thereby obtaining a temporarily synchronized set of RF field evolution and low frequency magnetic field evolution.

9. The method as defined in claim 8, wherein said pulsed excitation and/or signal acquisition of said magnetic field detectors is triggered by a feature of the RF signal in the first RF band.

10. The method as defined in one of claim 8, further comprising the step of calculating a temporal evolution of the magnetization based on said temporarily synchronized set of RF field evolution and low frequency magnetic field evolution.

11. The method as defined in one of claim 8, wherein said temporarily synchronized set of RF field evolution and low frequency magnetic field evolution is used for adjusting the RF field in said first RF band and/or for adjusting superimposed low-frequency magnetic fields.

12. The method as defined in one of claim 8, wherein said temporarily synchronized set of RF field evolution, low-frequency magnetic field evolution and object signals is used for reconstruction of images or spectra.

13. The method as defined in claim 8 for operating a dynamic field camera arrangement and further comprising means for detecting an acoustic signal, wherein said acoustic signal is acquired temporarily synchronized with said set of RF field evolution and low frequency magnetic field evolution.

14. A method of operating a dynamic field camera arrangement according to claim 2 in conjunction with a magnetic resonance (MR) apparatus, the MR apparatus comprising:

means for generating a main magnetic field in a detection volume of said MR apparatus;

means for generating superimposed gradient and/or higher order magnetic fields and an RF field limited to a first RF band according to an MR sequence for forming images or spectra;

means for acquiring object signals from an object located in said detection volume;

the method comprising the steps of:

subjecting said low-frequency magnetic field detectors to a pulsed excitation, acquiring MR signals from said low-frequency magnetic field detectors and processing the same to obtain low frequency spatiotemporal magnetic field characteristics in said detection volume, wherein said pulsed excitation and said MR detector signal is in a second RF band that does not overlap said first RF band acquiring RF signals from said set of RF detectors;

acquiring object signals from said object during execution of said MR sequence;

thereby obtaining a temporarily synchronized set of RF field evolution, low-frequency magnetic field evolution and object signals.

15. The dynamic field camera arrangement as defined in 2 further comprising an RF load device.

16. The dynamic field camera arrangement as defined in claim 1, further comprising means for detecting an acoustic signal.

17. The dynamic field camera arrangement as defined in 16, further comprising an RF load device.

18. The dynamic field camera arrangement as defined in claim 1, further comprising an RF load device.

19. The dynamic field camera arrangement as defined in claim 1, wherein said MR active substance is selected from the group consisting of:

hexafluoro-2,3-bis(trifluoromethyl)butane-2,3-diol,
hexafluoro-2-propanol,
2,2,2-trifluoroethanol,
3,3,3-trifluoro-1-propanol,
trifluoroacetic acid,
hexafluorobenzene, and
perfluoro 15-crown-5;

Wherein any hydrogen is independently selected from $^1H$ and $^2H$;

said magnetic field detector further comprising at least one dopant admixed to said MR active substance, said dopant being a complex of a divalent or trivalent metal cation with two or three equivalents, respectively, of a charge neutralizing ligand, wherein said ligand is selected from the group consisting of:

acetylacetonate,
6,6,7,7,8,8,8-heptafluoro-2,2-dimethyl-3,5-octanedionate,
hexafluoroacetylacetonate,
acetate,
tetramethylcyclopentadienyl,
propoxide, and
2,2,6,6-tetramethyl-3,5-heptanedionate, wherein any hydrogen is independently selected from $^1H$ and $^2H$;

and wherein said metal cation is selected from the group consisting of Fe, Mn, Cr, Co, Ni, Cu or anyone of the rare earth metals.

20. The dynamic field camera arrangement as defined in claim 19, wherein said magnetic field detector further comprises a solubilizer compound admixed to said MR active substance and to said dopant.

* * * * *

UNITED STATES PATENT AND TRADEMARK OFFICE
CERTIFICATE OF CORRECTION

PATENT NO.         : 9,791,526 B2
APPLICATION NO.    : 14/112660
DATED              : October 17, 2017
INVENTOR(S)        : Christoph Barmet et al.

It is certified that error appears in the above-identified patent and that said Letters Patent is hereby corrected as shown below:

In the Specification

Column 8, Line 9, delete "MO" and insert --M0--

In the Claims

Claim 1, Line 36, delete "hand" and insert --band--

Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*